(12) United States Patent
Minowa et al.

(10) Patent No.: US 9,300,884 B2
(45) Date of Patent: Mar. 29, 2016

(54) SOLID-STATE IMAGE SENSOR AND CAMERA HAVING A PLURALITY OF PHOTOELECTRIC CONVERTERS UNDER A MICROLENS

(71) Applicant: CANON KABUSHIKI KAISHA, Tokyo (JP)

(72) Inventors: Masaaki Minowa, Kawasaki (JP); Hidekazu Takahashi, Zama (JP); Yuichiro Yamashita, Sendai (JP); Akira Okita, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 215 days.

(21) Appl. No.: 13/627,507

(22) Filed: Sep. 26, 2012

(65) Prior Publication Data

US 2013/0083225 A1 Apr. 4, 2013

(30) Foreign Application Priority Data

Oct. 3, 2011 (JP) .................................. 2011-219562

(51) Int. Cl.
*H04N 5/225* (2006.01)
*H01L 27/146* (2006.01)
*H04N 5/335* (2011.01)

(52) U.S. Cl.
CPC ............ *H04N 5/335* (2013.01); *H01L 27/1464* (2013.01); *H01L 27/14607* (2013.01); *H01L 27/14627* (2013.01); *H01L 27/14641* (2013.01)

(58) Field of Classification Search
CPC .................... H01L 27/1464; H01L 27/14627; H01L 27/14603; H01L 27/14607; H01L 27/14641; H04N 5/335
See application file for complete search history.

(56) References Cited

U.S. PATENT DOCUMENTS

| | | | |
|---|---|---|---|
| 6,973,265 B2 | 12/2005 | Takahashi | |
| 6,995,800 B2 | 2/2006 | Takahashi et al. | |
| 7,187,052 B2 | 3/2007 | Okita et al. | |
| 7,280,146 B2 | 10/2007 | Takahashi et al. | |
| 7,283,305 B2 | 10/2007 | Okita et al. | |
| 7,294,818 B2 | 11/2007 | Matsuda et al. | |
| 7,321,110 B2 | 1/2008 | Okita et al. | |
| 7,408,210 B2 | 8/2008 | Ogura et al. | |
| 7,456,880 B2 | 11/2008 | Okita et al. | |
| 7,460,162 B2 | 12/2008 | Koizumi et al. | |

(Continued)

FOREIGN PATENT DOCUMENTS

| JP | 2001-250931 A | 9/2001 |
|---|---|---|
| JP | 2004-186311 A | 7/2004 |

(Continued)

*Primary Examiner* — Shahbaz Nazrul
(74) *Attorney, Agent, or Firm* — Fitzpatrick, Cella, Harper & Scinto

(57) ABSTRACT

An image sensor includes a semiconductor substrate having first and second faces. The sensor includes a plurality of pixel groups each including pixels, each pixel having a photoelectric converter and a wiring pattern, the converter including a region whose major carriers are the same with charges to be accumulated in the photoelectric converter. The sensor also includes a microlenses which are located so that one microlens is arranged for each pixel group. The wiring patterns are located at a side of the first face, and the plurality of microlenses are located at a side of the second face. Light-incidence faces of the regions of the photoelectric converters of each pixel group are arranged along the second face such that the light-incidence faces are apart from each other in a direction along the second face.

8 Claims, 12 Drawing Sheets

(56) References Cited

U.S. PATENT DOCUMENTS

| | | | |
|---|---|---|---|
| 7,466,003 B2 | 12/2008 | Ueno et al. | |
| 7,514,732 B2 | 4/2009 | Okita et al. | |
| 7,522,341 B2 * | 4/2009 | Mouli | 359/619 |
| 7,538,804 B2 | 5/2009 | Okita et al. | |
| 7,538,810 B2 | 5/2009 | Koizumi et al. | |
| 7,550,793 B2 | 6/2009 | Itano et al. | |
| 7,557,847 B2 | 7/2009 | Okita et al. | |
| 7,561,199 B2 | 7/2009 | Noda et al. | |
| 7,623,056 B2 | 11/2009 | Yamashita | |
| 7,633,539 B2 | 12/2009 | Yamashita | |
| 7,688,377 B2 | 3/2010 | Matsuda et al. | |
| 7,692,713 B2 | 4/2010 | Kinugasa et al. | |
| 7,741,593 B2 | 6/2010 | Iwata et al. | |
| 7,742,088 B2 | 6/2010 | Shizukuishi | |
| 7,787,037 B2 | 8/2010 | Ono et al. | |
| 7,817,199 B2 | 10/2010 | Yamashita et al. | |
| 7,872,286 B2 | 1/2011 | Okita et al. | |
| 7,920,192 B2 | 4/2011 | Watanabe et al. | |
| 7,928,477 B2 | 4/2011 | Kobayashi et al. | |
| 7,982,789 B2 | 7/2011 | Watanabe et al. | |
| 8,009,213 B2 | 8/2011 | Okita et al. | |
| 8,013,369 B2 | 9/2011 | Iwata et al. | |
| 8,081,245 B2 | 12/2011 | Itano et al. | |
| 8,094,225 B2 | 1/2012 | Yamashita | |
| 8,106,955 B2 | 1/2012 | Okita et al. | |
| 8,115,848 B2 | 2/2012 | Onuki et al. | |
| 8,158,920 B2 | 4/2012 | Suzuki et al. | |
| 8,159,573 B2 | 4/2012 | Suzuki et al. | |
| 8,159,577 B2 | 4/2012 | Iwata et al. | |
| 8,169,498 B2 | 5/2012 | Yamashita | |
| 8,199,235 B2 | 6/2012 | Okita et al. | |
| 8,223,238 B2 | 7/2012 | Kuroda et al. | |
| 8,278,613 B2 | 10/2012 | Okita et al. | |
| 8,426,238 B2 | 4/2013 | Nishizawa et al. | |
| 8,704,934 B2 | 4/2014 | Yokogawa | |
| 2004/0100570 A1 * | 5/2004 | Shizukuishi | 348/272 |
| 2006/0268139 A1 * | 11/2006 | Kobayashi et al. | 348/294 |
| 2007/0205439 A1 | 9/2007 | Okita et al. | |
| 2009/0227064 A1 * | 9/2009 | Suzuki et al. | 438/73 |
| 2009/0303371 A1 | 12/2009 | Watanabe et al. | |
| 2010/0118172 A1 * | 5/2010 | McCarten et al. | 348/302 |
| 2010/0128152 A1 * | 5/2010 | Hayasaka et al. | 348/280 |
| 2010/0141816 A1 * | 6/2010 | Maruyama et al. | 348/294 |
| 2010/0165167 A1 | 7/2010 | Sugiyama et al. | |
| 2010/0171157 A1 * | 7/2010 | Hynecek | 257/292 |
| 2010/0182465 A1 | 7/2010 | Okita | |
| 2010/0200738 A1 | 8/2010 | Yamashita | |
| 2010/0230583 A1 | 9/2010 | Nakata et al. | |
| 2010/0292579 A1 * | 11/2010 | Sato | 600/474 |
| 2010/0328302 A1 | 12/2010 | Yamashita et al. | |
| 2011/0013062 A1 | 1/2011 | Yamashita | |
| 2011/0019042 A1 | 1/2011 | Yamaguchi | 348/280 |
| 2011/0025896 A1 | 2/2011 | Yamashita et al. | |
| 2011/0032379 A1 | 2/2011 | Kobayashi et al. | |
| 2011/0058070 A1 * | 3/2011 | Awazu | 348/241 |
| 2011/0080492 A1 | 4/2011 | Matsuda et al. | |
| 2011/0080493 A1 | 4/2011 | Kono et al. | |
| 2011/0109776 A1 | 5/2011 | Kawai | |
| 2011/0156104 A1 | 6/2011 | Yamaguchi | 257/222 |
| 2011/0157398 A1 | 6/2011 | Okita et al. | |
| 2011/0169996 A1 | 7/2011 | Takada et al. | |
| 2011/0176045 A1 * | 7/2011 | Ahn et al. | 348/308 |
| 2011/0181747 A1 * | 7/2011 | Kido et al. | 348/222.1 |
| 2011/0234868 A1 | 9/2011 | Yamashita et al. | |
| 2011/0242380 A1 | 10/2011 | Ogura et al. | |
| 2011/0273597 A1 * | 11/2011 | Ishiwata | 348/272 |
| 2011/0273598 A1 | 11/2011 | Ogino et al. | |
| 2012/0006993 A1 | 1/2012 | Arishima et al. | |
| 2012/0007197 A1 | 1/2012 | Kikuchi et al. | |
| 2012/0007203 A1 | 1/2012 | Kono et al. | |
| 2012/0008030 A1 | 1/2012 | Kono et al. | |
| 2012/0008031 A1 | 1/2012 | Yamashita et al. | |
| 2012/0008177 A1 | 1/2012 | Fujimura et al. | |
| 2012/0026371 A1 | 2/2012 | Itano et al. | |
| 2012/0194696 A1 | 8/2012 | Ohshitanai et al. | |
| 2012/0194714 A1 | 8/2012 | Yamashita | |
| 2012/0298841 A1 | 11/2012 | Yamashita et al. | |
| 2013/0161774 A1 * | 6/2013 | Okigawa | 257/432 |
| 2013/0241023 A1 | 9/2013 | Nishizawa et al. | |
| 2013/0342751 A1 * | 12/2013 | Yoshimura | 348/349 |

FOREIGN PATENT DOCUMENTS

| | | |
|---|---|---|
| JP | 2008-270298 A | 11/2008 |
| JP | 2009-295937 A | 12/2009 |
| JP | 2010-161200 A | 7/2010 |
| JP | 2011-029337 A | 2/2011 |
| JP | 2011-082253 A | 4/2011 |
| JP | 2011-129785 A | 6/2011 |
| JP | 2011-138927 A | 7/2011 |
| JP | 2011-142330 A | 7/2011 |
| WO | 2010/056285 A1 | 5/2010 |
| WO | 2012026292 * | 3/2012 |

* cited by examiner

F I G. 2
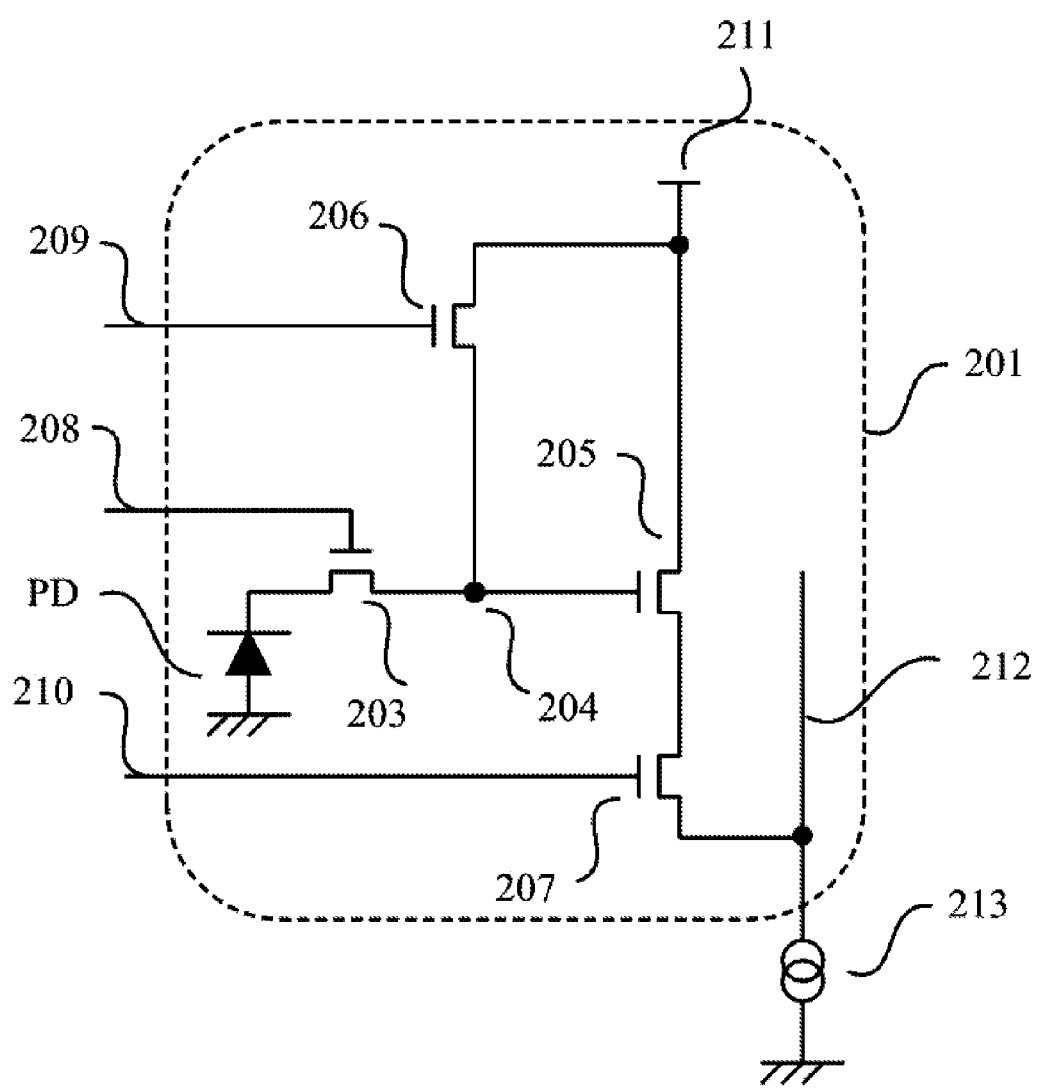

F I G. 7A
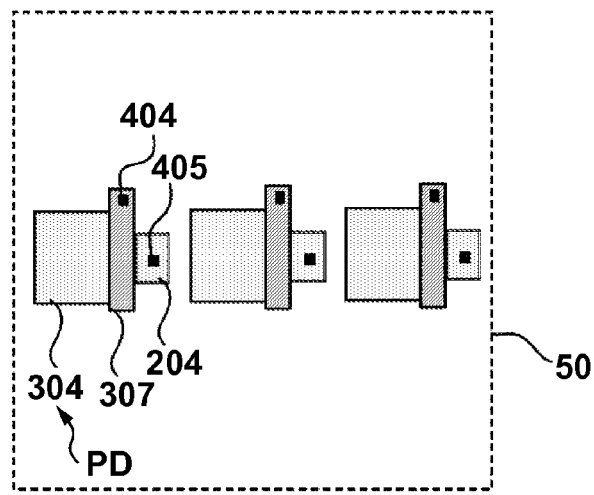
F I G. 7B
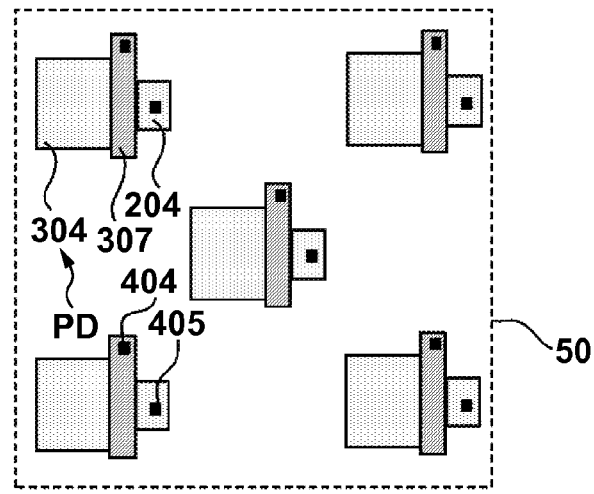
F I G. 7C
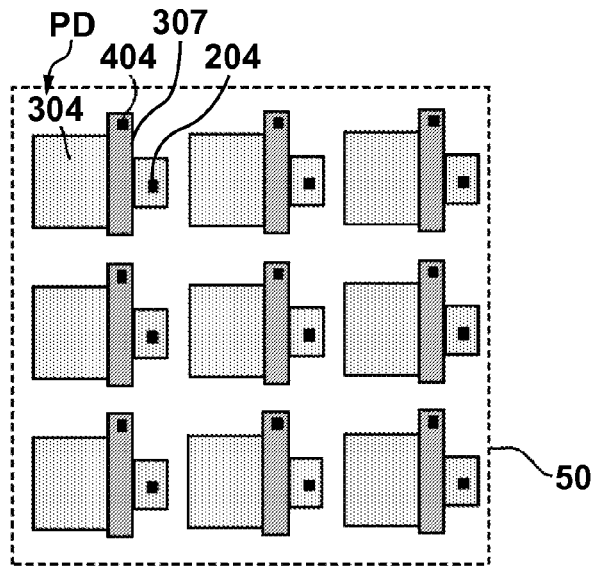

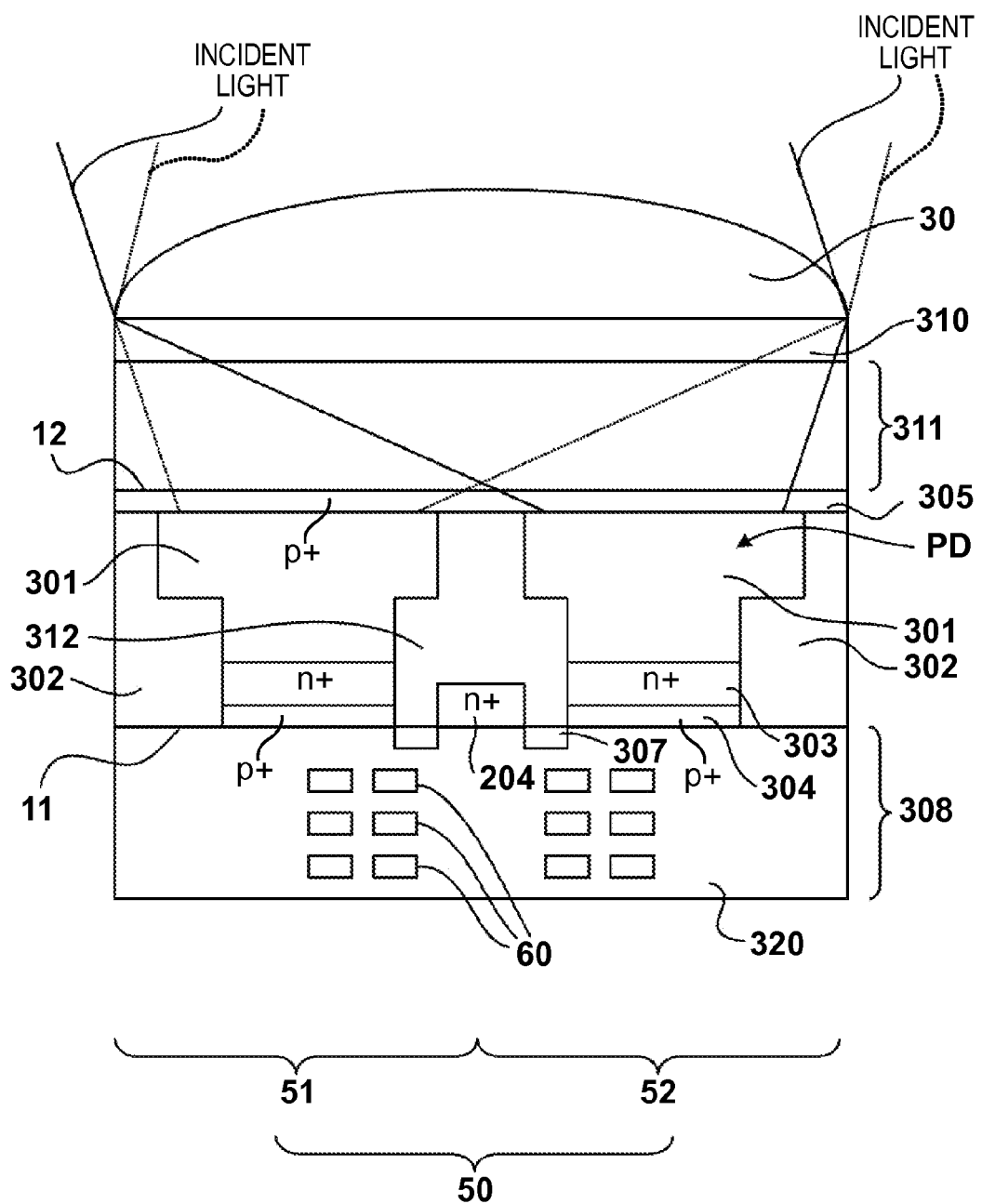
F I G. 11

SOLID-STATE IMAGE SENSOR AND CAMERA HAVING A PLURALITY OF PHOTOELECTRIC CONVERTERS UNDER A MICROLENS

BACKGROUND OF THE INVENTION

1. Field of the Invention

The present invention relates to a solid-state image sensor and camera.

2. Description of the Related Art

Japanese Patent Laid-Open No. 2001-250931 discloses a solid-state image sensor having a configuration in which N neighboring pixels form one group, and one microlens is located on N pixels which belong to an identical group, as a solid-state image sensor appended with a focus detection function based on a phase-difference detection method.

In the solid-state image sensor described in Japanese Patent Laid-Open No. 2001-250931, since transistors included in pixels are located on the light-receiving face side, an area of a light-receiving unit is limited by transistors and wiring patterns. For this reason, as a pixel size is reduced, it becomes difficult to obtain sufficient sensitivity.

SUMMARY OF THE INVENTION

The present invention provides a technique advantageous in improvement of sensitivity in a solid-state image sensor having a configuration in which a plurality of pixels are assigned to each microlens.

One of the aspects of the present invention provides a solid-state image sensor, which includes a semiconductor substrate having a first face and a second face opposite to the first face, the sensor comprising: a plurality of pixel groups each including a plurality of pixels, each pixel having a photoelectric converter formed in the semiconductor substrate and a wiring pattern which configures a part of a circuit in the pixel, the photoelectric converter including a region whose major carriers are the same with charges to be accumulated in the photoelectric converter as a signal; and a plurality of microlenses which are located so that one microlens is arranged for each pixel group, wherein the wiring patterns are located at a side of the first face of the semiconductor substrate, and the plurality of microlenses are located at a side of the second face of the semiconductor substrate, and light-incidence faces of the regions of the photoelectric converters of each pixel group are arranged along the second face such that the light-incidence faces are apart from each other in a direction along the second face.

Further features of the present invention will become apparent from the following description of exemplary embodiments with reference to the attached drawings.

BRIEF DESCRIPTION OF THE DRAWINGS

FIG. 2 is a circuit diagram showing an example of the circuit configuration (equivalent circuit) of a pixel;

FIGS. 7A to 7C are views showing configuration examples of a pixel group when viewed from the wiring layer side;

FIG. 11 is a sectional view showing a configuration example of a pixel group according to the sixth embodiment.

DESCRIPTION OF THE EMBODIMENTS

Figure 12A:
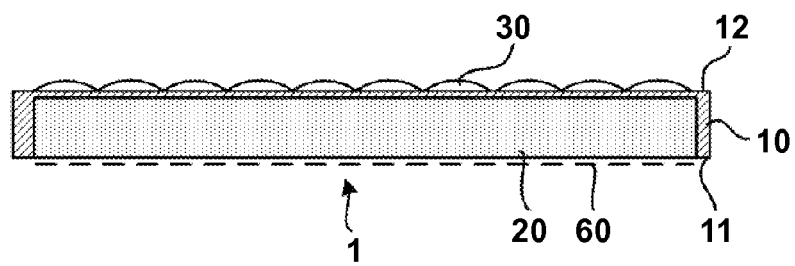
FIGS. 12A and 12B are views illustrating the configuration of a solid-state image sensor according to an embodiment.
Figure 12B:
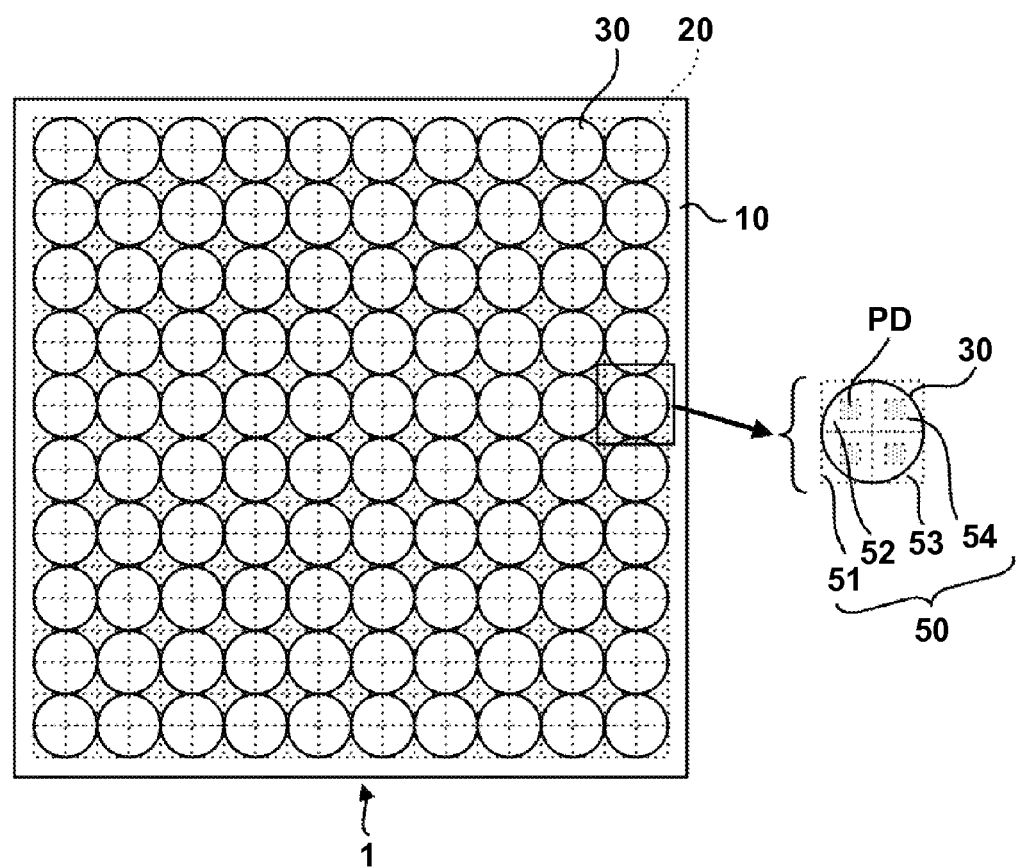

A solid-state image sensor according to the first embodiment of the present invention will be described below with reference to FIGS. 1A, 1B, 2, 3, 4A to 4D, 12A, and 12B. FIGS. 12A and 12B are respectively a sectional view and plan view illustrating the configuration of a solid-state image sensor 1 according to a representative embodiment of the present invention. The solid-state image sensor 1 includes a semiconductor substrate 10 having a first face 11, and second face 12 opposite to the first face 11. FIG. 12B is a plan view when the solid-state image sensor 1 is viewed from the second face 12 side. The solid-state image sensor 1 includes a pixel array 20 in which a plurality of pixel groups 50 are arranged, and a plurality of microlenses 30 which are located so that one microlens 30 is assigned to each pixel group 50. Each pixel group 50 includes a plurality of pixels 51, 52, 53, and 54, each of which includes a photoelectric converter PD and a wiring pattern 60 that partially forms a circuit in that pixel. The photoelectric converters PD are formed on the semiconductor substrate 10, the wiring patterns 60 are located at the first face 11 side of the semiconductor substrate 10, and the plurality of microlenses 30 are located at the second face 12 side of the semiconductor substrate 10. The photoelectric converters PD are arranged between the first and second faces 11 and 12 of the semiconductor substrate 10 along the first and second faces 11 and 12. The solid-state image sensor 1 may be implemented as a MOS type image sensor, a CCD image sensor, or other image sensors.

Figure 1A:
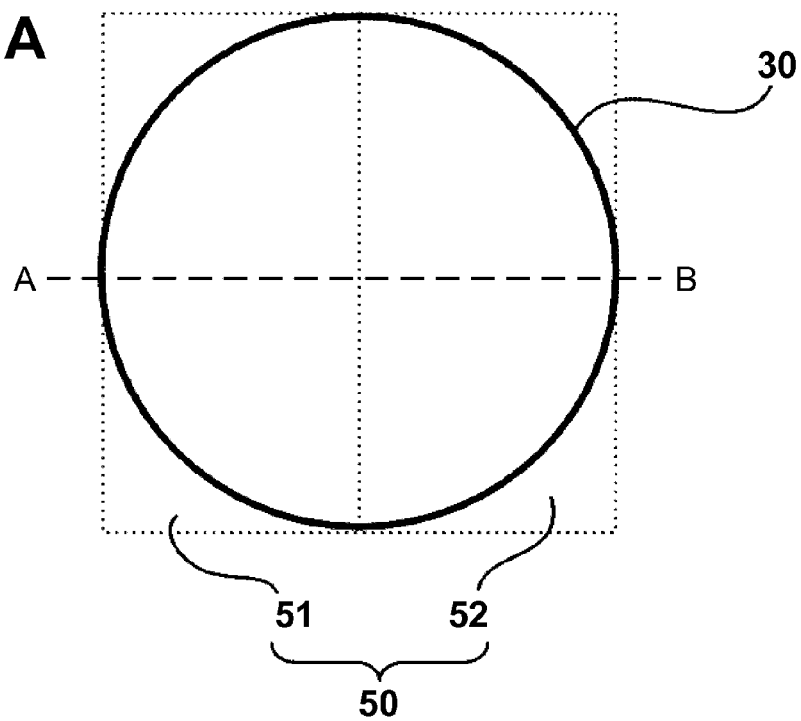
FIGS. 1A and 1B are plan views showing configuration examples of a pixel group according to the first embodiment.
Figure 1B:
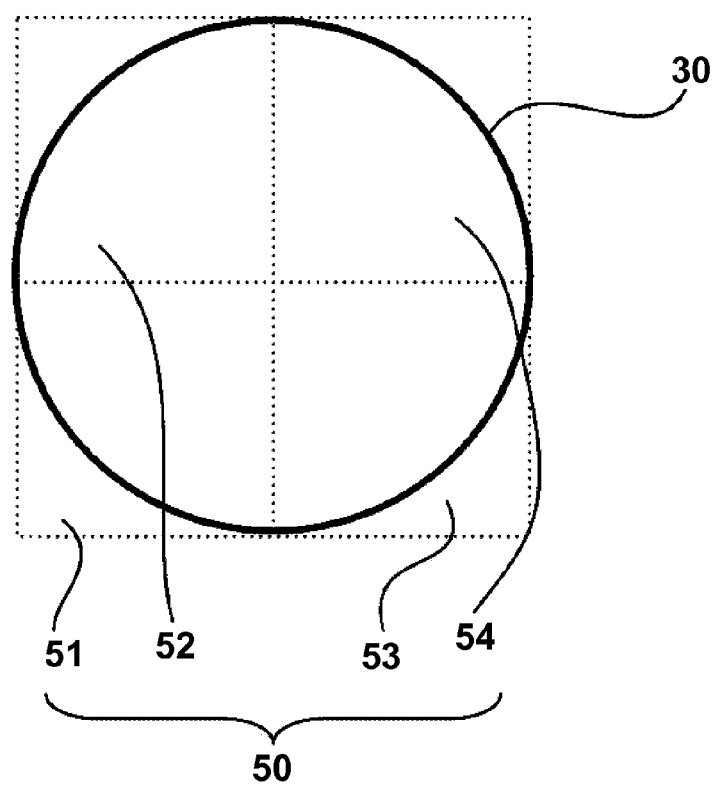

FIGS. 1A and 1B show two configuration examples of the pixel group 50. Dotted lines indicate regions of respective pixels 51, 52, 53, and 54. In the configuration example shown in FIG. 1A, two pixels 51 and 52 are assigned to one microlens 30, that is, the pixel group 50 is configured by the two pixels 51 and 52. In the configuration example shown in FIG. 1B, four pixels 51, 52, 53, and 54 are assigned to one microlens 30, that is, the pixel group 50 is configured by the four pixels 51, 52, 53, and 54. Note that the number and layout of pixels which configure the pixel group 50 are not limited to the configuration examples shown in FIGS. 1A and 1B.

With the configuration in which one microlens 30 is assigned to one pixel group 50 including a plurality of pixels, light passing through different regions of a pupil of an image sensing lens which forms an image of an object on the image sensing plane of the solid-state image sensor 1 can be detected by the plurality of pixels of each pixel group 50. For the sake of descriptive convenience, assume that the different regions of the pupil of the image sensing lens are defined as first and second regions, and the plurality of pixels in each pixel group 50 include first and second pixels. A first image is obtained by detecting light which passes through the first region by the first pixels of the plurality of pixel groups 50, and a second image is obtained by detecting light which passes through the second region by the second pixels of the plurality of pixel groups 50. From a deviation between the first and second images, a deviation amount (that is, a defocus amount) between an image formed by the image sensing lens and the image sensing plane of the solid-state image sensor 1 or a distance to the object can be detected. Such method is called a phase-difference detection method. In the example of FIG. 1A, for example, the first image is obtained from signals of the pixels 51 of the respective pixel groups 50, and the second image is obtained from signals of the pixels 52 of the respective pixel groups 50. In the example of FIG. 1B, for example, the first image is obtained by adding signals of the pixels 51 and 52 (or pixels 51 and 53) of the respective pixel groups 50, and the second image is obtained by adding signals of the pixels 53 and 54 (or pixels 52 and 54) of the respective pixel groups 50. In the example of FIG. 1B, by changing pixels, signals of which are to be added, phase differences can be detected in the vertical and horizontal directions. Note that in a normal image sensing operation, signals of all the pixels under one microlens 30 can be added.

FIG. 2 is a circuit diagram showing an example of the circuit configuration (equivalent circuit) of each pixel included in the pixel group 50. A pixel 201 includes at least a photoelectric converter (for example, photodiode) PD and a wiring pattern. The photoelectric converter PD accumulates a charge generated by photoelectric conversion of incoming light. When the solid-state image sensor 1 is configured as a MOS type image sensor, the wiring pattern can include, for example, that which configures control lines 208, 209, and 210, a vertical wiring line 212, and the like, and that which interconnects transistors. When the solid-state image sensor 1 is configured as a CCD image sensor, the wiring pattern can include, for example, that which transmits vertical CCD driving pulses.

FIG. 2 shows an example of the pixel when the solid-state image sensor 1 is configured as a MOS type image sensor. The pixel 201 can include a transfer transistor 203, floating diffusion 204, reset transistor 206, selection transistor 207, and amplifier transistor 205 in addition to the photoelectric converter PD. The reset transistor 206 is connected between a power line 211 and the floating diffusion 204. The reset transistor 206 resets the potential of the floating diffusion 204 to a reset potential in response to a reset pulse applied to the control line (reset signal line) 209. The transfer transistor 203 transfers charges accumulated in the photoelectric converter PD to the floating diffusion 204 in response to a transfer pulse applied to the control line (transfer signal line) 208. Thus, the potential of the floating diffusion 204 changes. The amplifier transistor 205 outputs a signal according to the potential of the floating diffusion 204 onto the vertical signal line 212. The amplifier transistor 205 configures a source-follower amplifier together with a current source 213 connected in series with the vertical output line 212. The selection transistor 207 is used to select a pixel of a row to be read, and selects the pixel of the row to be read while the control line (row selection line) 210 is at an active level.

Note that one of two diffusion regions (source and drain) of the transfer transistor 203 is commonized with the photoelectric converter PD, and the other region is commonized with the floating diffusion 204. The gate electrode of the transfer transistor 203 forms a channel through which charges accumulated in the photoelectric converter PD are transferred to the floating diffusion 204.

Figure 3:
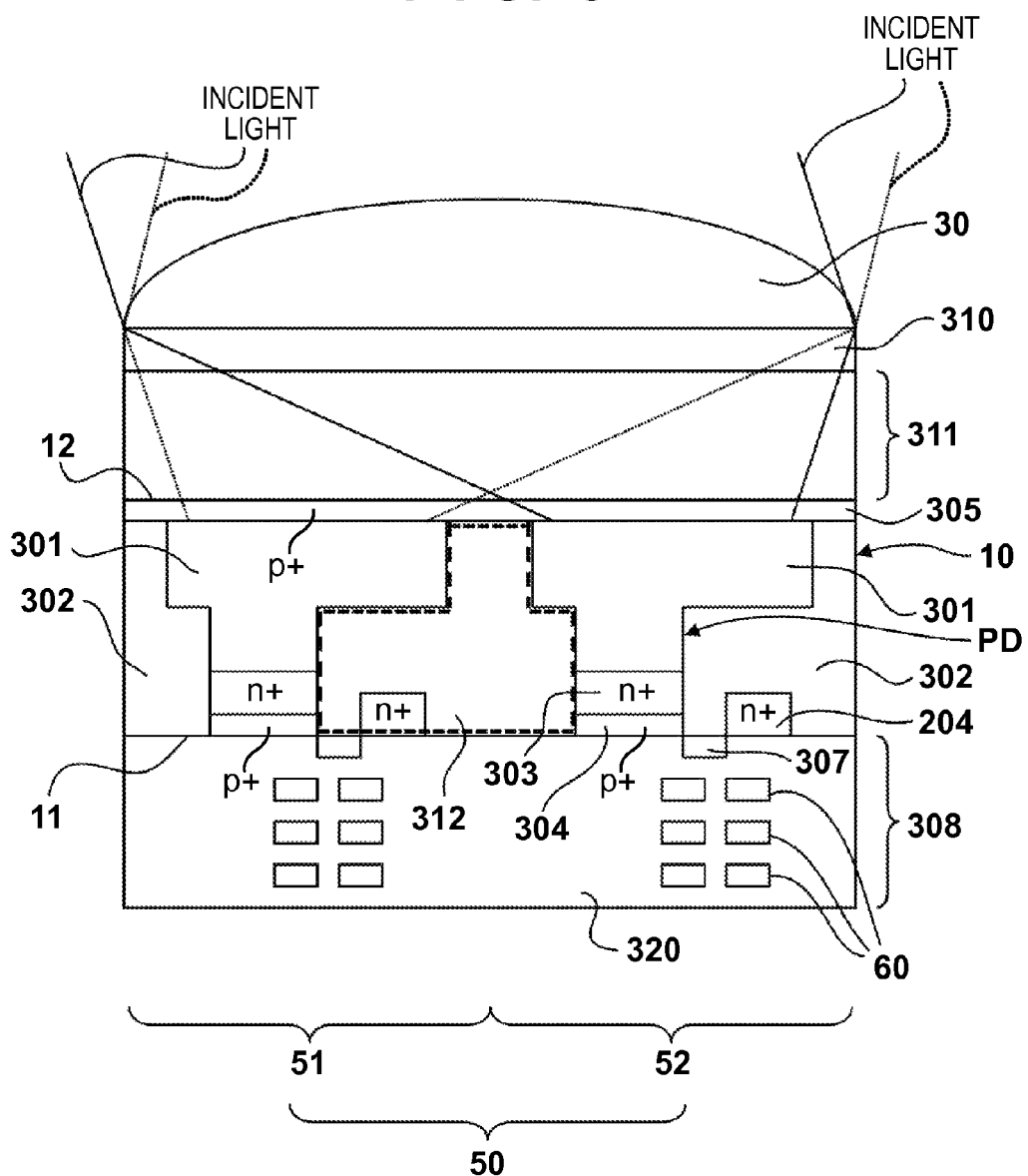
FIG. 3 is a sectional view taken along an AB line in FIG. 1A.

FIG. 3 is a sectional view taken along an AB line in FIG. 1A. The configuration of the solid-state image sensor 1 or pixel group 50 according to the first embodiment will be described below with reference to FIG. 3. In the example shown in FIG. 3, an n-type semiconductor substrate 10 is used. Pixels are isolated from each other by a deep p-well 302 between different pixel groups 50. In a single pixel group 50, pixels are isolated from each other by a deep p-well 312. The photoelectric converter PD is formed in a region where the p-well 302 or 312 is not formed. The photoelectric converter PD includes an n-type region 301, and $n^+$-type region 303 which accumulates charges (electrons) as a signal. Majority carriers in the n-type region 301 and $n^+$-type region 303 are the charges that are accumulated in the $n^+$-type region 303 as a signal. Light-incidence faces of the n-type regions 301 of the photoelectric converters of each pixel group are arranged along the second face 12 such that the light-incidence faces are apart from each other in a direction along the second face 12.

The photoelectric converter PD includes a $p^+$-type region 304 which is located at the first face side (wiring layer side) of the $n^+$-type region 303, and a $p^+$-type region 305 located at the second face side (light-receiving face side) of the n-type region 301, and is configured as an embedded photodiode. The $p^+$-type region 305 on the light-receiving face side is formed over the entire region of the pixel array. A gate electrode 307 is that of the transfer transistor 203 which transfers charges from the $n^+$-type region 304 as a charge accumulation-type region of the photoelectric converter PD to the floating diffusion 204. The gate electrode 307 is located on the first face via a gate insulating film (not shown). Also, the floating diffusion (FD) 204 is an n-type region.

FIG. 3 illustrates only the transfer transistor of transistors included in the pixel group 50 or pixel. However, in a section taken along the AB line of FIG. 1A, other transistors may be located. A wiring layer 308 is located on the side of the first face 11 of the semiconductor substrate 10. The wiring layer 308 has a structure in which the wiring patterns 60 are located in an insulating film 320. The microlens 30 is located on the side of the second face 12 of the semiconductor substrate 10. A color filter 310 can be located between the microlens 30 and semiconductor substrate 10. An insulating layer 311 can be located between the color filter 310 and semiconductor substrate 10. The insulating layer 311 specifies a distance between the microlens 30 and semiconductor substrate 10 according to a focal length of the microlens 30.

The $n^+$-type region 303 as the charge accumulation-type region of the photoelectric converter PD is completely depleted by a reset operation, and then accumulates electrons generated by photoelectric conversion according to light incidence. For this reason, an area of the photoelectric converter PD can be assured to be as broad as possible to get close to the neighboring photoelectric converter PD within a range in which isolations from the floating diffusion 204 and the photoelectric converter PD of the neighboring pixel are kept. In FIG. 3, the area of the photoelectric converter PD on the second face 12 side (light-receiving face or microlens 30 side) is broader than that on the first face 11 side (wiring layer 308 side). Thus, charges generated by efficiently photoelectrically converting incoming light can be accumulated in the photoelectric converter PD. The area in this case is that of a face parallel to the first or second face.

Figure 4A:
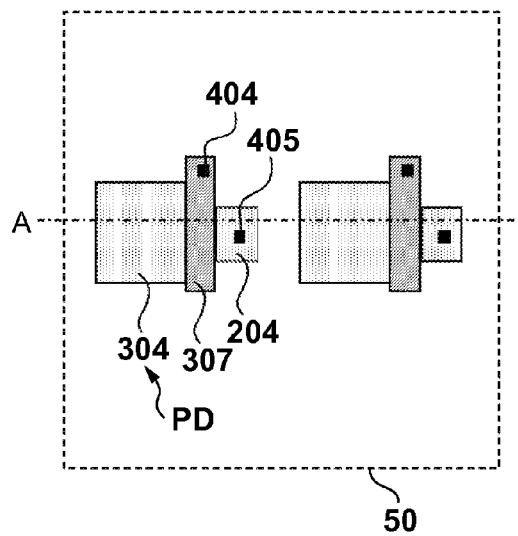
FIGS. 4A to 4D are views showing configuration examples of a pixel group when viewed from the wiring layer side.
Figure 4B:
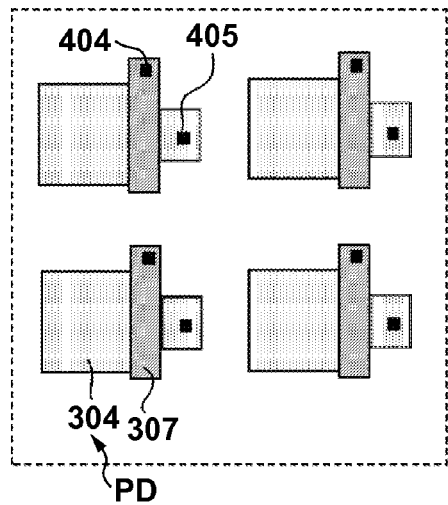
Figure 4C:
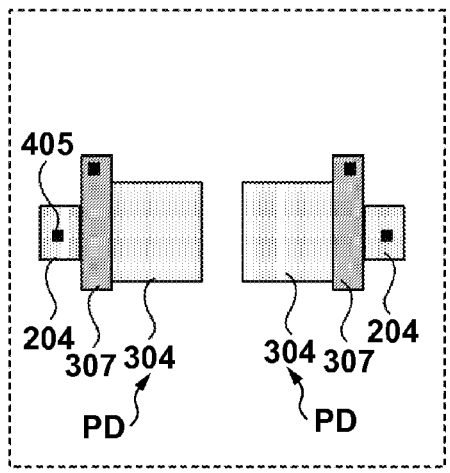
Figure 4D:
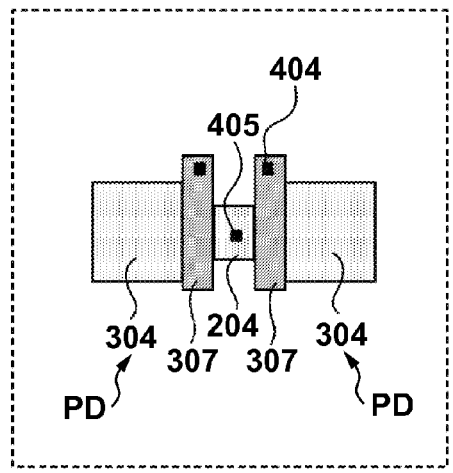

FIGS. 4A to 4D show four configuration examples of the pixel group 50 when viewed from the wiring layer 308 side. FIGS. 4A, 4C, and 4D correspond to the configuration example shown in FIG. 1A, and FIG. 4B corresponds to the configuration example shown in FIG. 1B. A dotted line of an outer frame of each of FIGS. 4A to 4D indicates a border line of the pixel group 50. Note that FIGS. 4A to 4D illustrate only the photoelectric converter PD, the gate electrode 307 of the transfer transistor, and the floating diffusion 204 of the circuit configuration described using FIG. 2. That is, FIGS. 4A to 4D do not illustrate the amplifier transistor, reset transistor, and selection transistor other than the transfer transistor, and the wiring pattern. In FIGS. 4A to 4D, reference numerals 404 and 405 denote contact holes. Note that FIG. 4A corresponds to FIG. 3. FIG. 4D will be described in detail later.

According to the first embodiment, the wiring patterns 60 are located on the side of the first face 11 of the semiconductor substrate 10, and the microlenses 30 are located on the side of the second face 12 of the semiconductor substrate 10. Hence, light is never intercepted by the wiring patterns 60, and a large light-receivable region can be assured. Furthermore, according to the first embodiment, when each pixel group 50 includes circuit elements such as transistors and the like, since the circuit elements are located on the side of the first face 11 of the semiconductor substrate 10, light is never intercepted by the circuit elements, and a large light-receivable region can be assured.

Figure 5A:
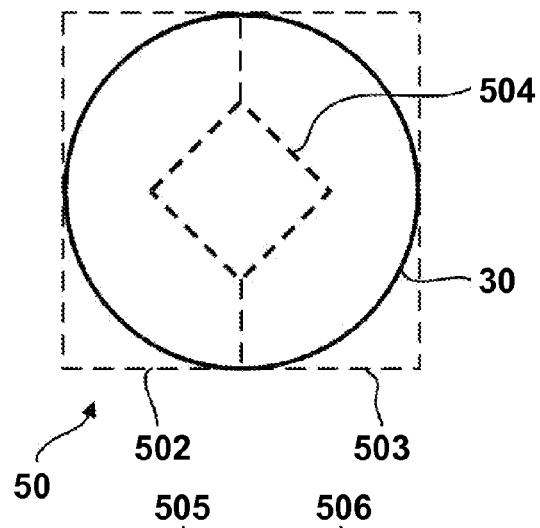
FIGS. 5A to 5C are plan views showing configuration examples of a pixel group according to the second embodiment.
Figure 5B:
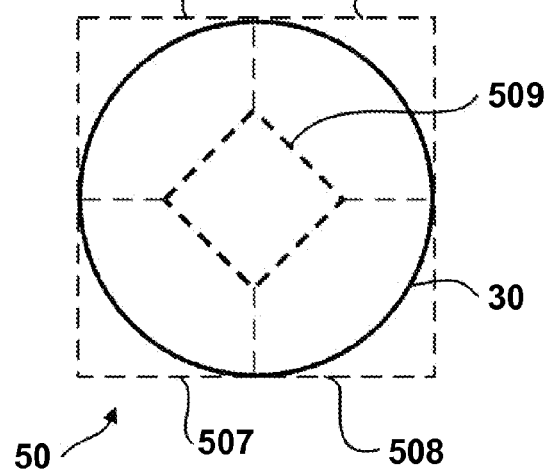
Figure 5C:
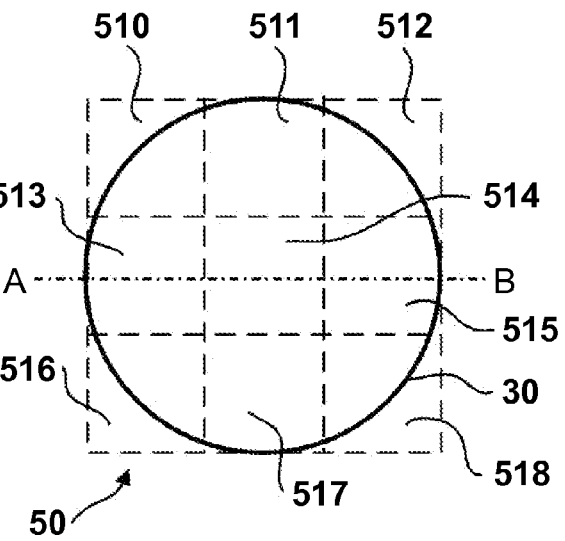

A solid-state image sensor according to the second embodiment of the present invention will be described below with reference to FIGS. 5A to 5C, 6, and 7. Items which are not mentioned in this embodiment can follow the first embodiment. FIGS. 5A to 5C show three configuration examples of a pixel group 50 according to the second embodiment. In the second embodiment, each pixel group 50 includes, as a plurality of photoelectric converters, a first photoelectric converter and a plurality of second photoelectric converters which are located to surround the first photoelectric converter.

In the example shown in FIG. 5A, one pixel group 50 is configured by three pixels 502, 503, and 504 respectively including photoelectric converters, and one microlens 30 is formed in correspondence with the three pixels 502, 503, and 504. In the example shown in FIG. 5B, one pixel group 50 is configured by five pixels 505 to 509 respectively including photoelectric converters, and one microlens 30 is formed in correspondence with the five pixels 505 to 509. In the example shown in FIG. 5C, one pixel group 50 is configured by nine pixels 510 to 518 respectively including photoelectric converters, and one microlens 30 is formed in correspondence with the nine pixels 510 to 518.

In the example of FIG. 5A, the pixel 504 including the first photoelectric converter is surrounded by the two pixels 502 and 503 respectively including the second photoelectric converters. That is, the first photoelectric converter is surrounded by the two second photoelectric converters. In the example of FIG. 5B, the pixel 509 including the first photoelectric converter is surrounded by the four pixels 505 to 508 respectively including the second photoelectric converters. That is, the first photoelectric converter is surrounded by the four second photoelectric converters. In the example of FIG. 5C, the pixel 514 including the first photoelectric converter is surrounded by the eight pixels 510 to 513 and 515 to 518 respectively including the second photoelectric converters. That is, the first photoelectric converter is surrounded by the eight second photoelectric converters.

In this configuration, when wiring patterns of pixels are located between the microlenses 30 and semiconductor substrate 10, each second photoelectric converter may be shaded by wiring patterns required to read out a signal from the first photoelectric converter surrounded by the second photoelectric converters. On the other hand, according to the configuration in which the wiring patterns are located on the side of the first face 11 of the semiconductor substrate 10, and the microlenses 30 are located on the side of the second face 12 of the semiconductor substrate 10 as in the present invention, the semiconductor substrate 10 or photoelectric converters are never shaded by the wiring patterns. Hence, a large light-receiving region (a region that can receive light) can be assured, thus improving the sensitivity.

Figure 6:
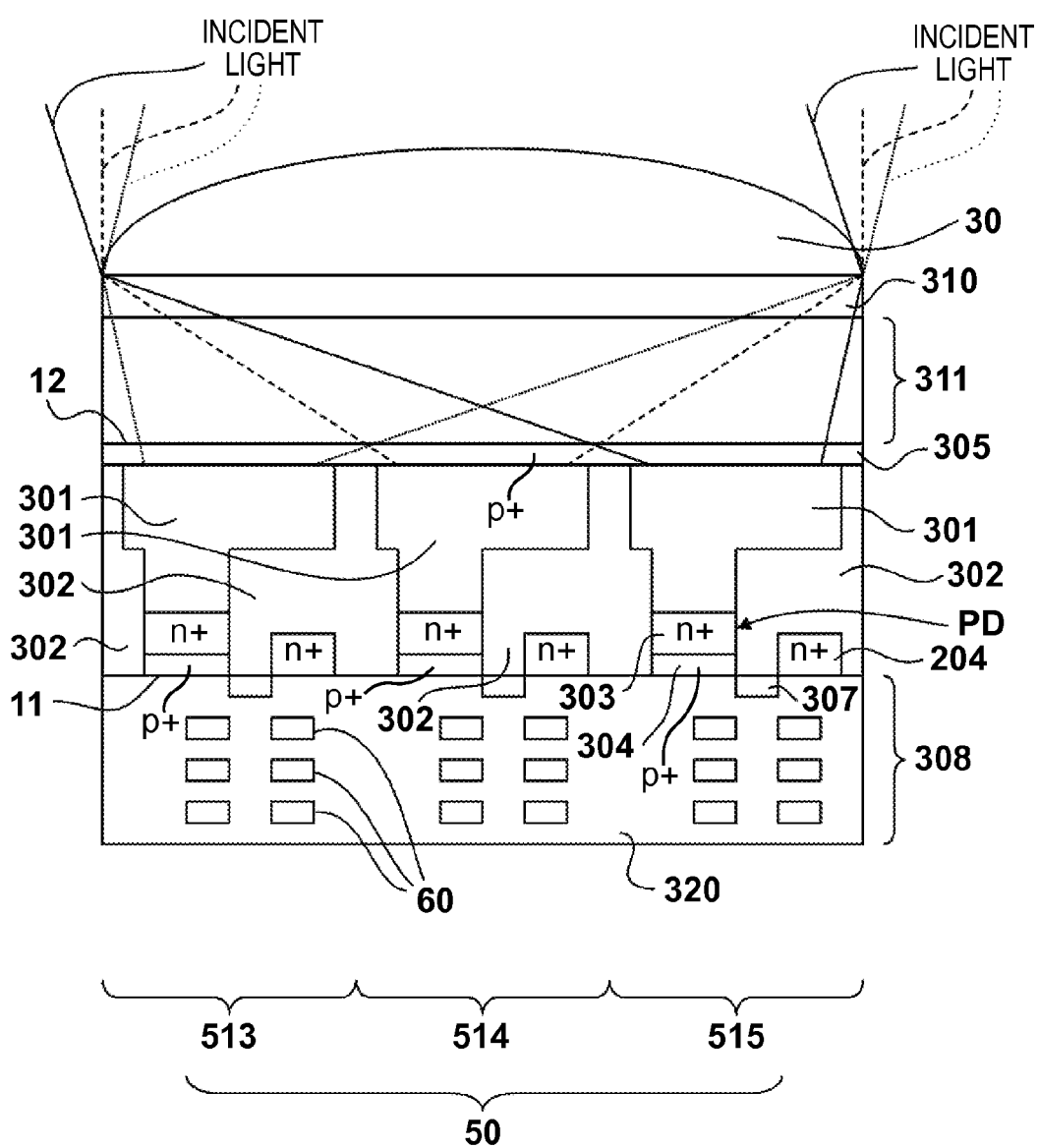
FIG. 6 is a sectional view taken along an AB line in FIG. 5C.

FIG. 6 is a sectional view taken along an AB line in FIG. 5C. In the example shown in FIG. 6, one pixel group 50 corresponding to one microlens 30 includes three pixels 513, 514, and 515. Each of the pixels 513, 514, and 515 includes a gate electrode 307 of a transfer transistor, floating diffusion 204, transistors (not shown; for example, a reset transistor, amplifier transistor, and selection transistor), and wiring pattern 60. Even in the configuration in which the pixel 514 is surrounded by surrounding pixels such as the pixels 513 and 515, the photoelectric converter PD is neither compressed nor shaded.

FIGS. 7A to 7C show three configuration examples of the pixel group 50 when viewed from the wiring layer 308. Note that FIGS. 7A to 7C illustrate only the photoelectric converter PD, the gate electrode 307 of the transfer transistor, and the floating diffusion 204 of the circuit configuration described using FIG. 2. That is, FIGS. 7A to 7C do not illustrate the amplifier transistor, reset transistor, and selection transistor other than the transfer transistor, and the wiring pattern. FIGS. 7A, 7B, and 7C respectively correspond to FIGS. 5A, 5B, and 5C.

A solid-state image sensor according to the third embodiment of the present invention will be described below with reference to FIGS. 1A, 1B, 3, and 4A to 4D. Items which are not mentioned in this embodiment can follow the first embodiment. In the third embodiment, at least a part of at least one circuit element (for example, an active element) included in a pixel is located between neighboring photoelectric converters PD in one pixel group 50 corresponding to one microlens 30. In the conventional configuration in which circuit elements (and wiring patterns) are located between the microlenses 30 and semiconductor substrate 10, when circuit elements are located between neighboring photoelectric converters PD, a light-receiving region is reduced. On the other hand, according to the third embodiment, in the configuration in which at least a part of at least one circuit element (for example, an active element) included in a pixel is located between neighboring photoelectric converters PD in one pixel group 50, the light-receiving region is not reduced by that part. Hence, a decrease in sensitivity can be suppressed.

For example, in the configuration example shown in FIGS. 1A, 3, and 4A, the gate electrode 307 of the transfer transistor 203 of the pixel 51 is formed in an isolation region between the photoelectric converter PD of the pixel 51 and the photoelectric converter PD of the neighboring pixel 52. With this layout, since the circuit element and wiring layer 308 are located on the side opposite to the light-receiving face, a decrease in sensitivity never occurs. When such layout is allowed, a translational symmetry layout when viewed from the wiring layer 308 side can be made, and a transfer direction of charges from the photoelectric converter PD to the floating diffusion 204 can be set in the same direction in all the pixels.

The translational symmetry layout is advantageous to eliminate characteristic variations for respective pixels when misalignment between a mask and a pattern already formed on a semiconductor substrate has occurred. For example, a case will be examined below wherein misalignment has occurred between an active region and a polysilicon patterning mask, and the gate electrode 307 of the transfer transistor shifts to the right in FIGS. 4A to 4D. In the translational symmetric layout shown in FIG. 4A, since all pixels have caused shifts in the same direction, characteristic variations between pixels are small. On the other hand, in a non-translational symmetry layout shown in FIG. 4C, an area of the floating diffusion 204 is enlarged and that of the photoelectric converter PD is reduced in the left pixel, and an area of the photoelectric converter PD is enlarged and that of the floating diffusion 204 is reduced in the right pixel. That is, a problem of characteristic variations for respective pixels has occurred.

In general, upon formation of an n$^+$-type region 303 and p$^+$-type region 304 so as to obtain required transfer characteristics, impurity ions are injected at an angle inclined from a normal direction to a semiconductor substrate. When all the pixels have a common charge transfer direction, an impurity injection required to form each of the n$^+$-type region 303 and p$^+$-type region 304 need only be performed once. Therefore, since an impurity can be injected under the same condition in all the pixels, transfer characteristic variations between pixels are small. By contrast, when all the pixels do not have a common charge transfer direction, a plurality of impurity injections required to form the n$^+$-type region 303 and p$^+$-type region 304 have to be performed while changing angles. Hence, manufacturing variations of doses and injection angles cannot be avoided, thus causing transfer characteristic variations for respective pixels. Such variations may lower focus detection precision when each photoelectric converter is used as a focus detection unit like in the present specification. Therefore, in order to suppress transfer characteristic variations, all the pixels desirably have a standardized charge transfer direction.

A solid-state image sensor according to the fourth embodiment of the present invention will be described below with reference to FIGS. 8 and 9. Items which are not mentioned in this embodiment can follow the first and second embodiments. The fourth embodiment has features associated with an inter-pixel isolation method in addition to the features of the first and second embodiments. In the configuration shown in FIGS. 8 and 9, a color filter 310 of one color is arranged for a plurality of pixels which belong to a pixel group 50 corresponding to one microlens 30. In a normal image sensing mode, signals of the plurality of pixels which belong to the pixel group 50 corresponding to one microlens 30 are added and read out. For this reason, when importance is attached to an image sensing function, signals need not be strictly isolated between the plurality of pixels which belong to the pixel group 50 corresponding to one microlens 30. Conversely, when signals are strictly isolated, a charge generated by light incident on a region between a plurality of photoelectric converters which belong to the pixel group 50 corresponding to one microlens 30 does not reach any photoelectric converter and is not accumulated, thus lowering the sensitivity. On the other hand, color filters of different colors are appended to pixels corresponding to different microlenses, that is, those which belong to different pixel groups, and signals are read out from these pixels as independent signals without being added in an image sensing mode. Hence, incomplete isolation of these pixels causes color mixing. In consideration of the above description, in the fourth embodiment, an isolation method of pixels which belong to a single pixel group and that of pixels which belong to different pixel groups are different.

Figure 8:
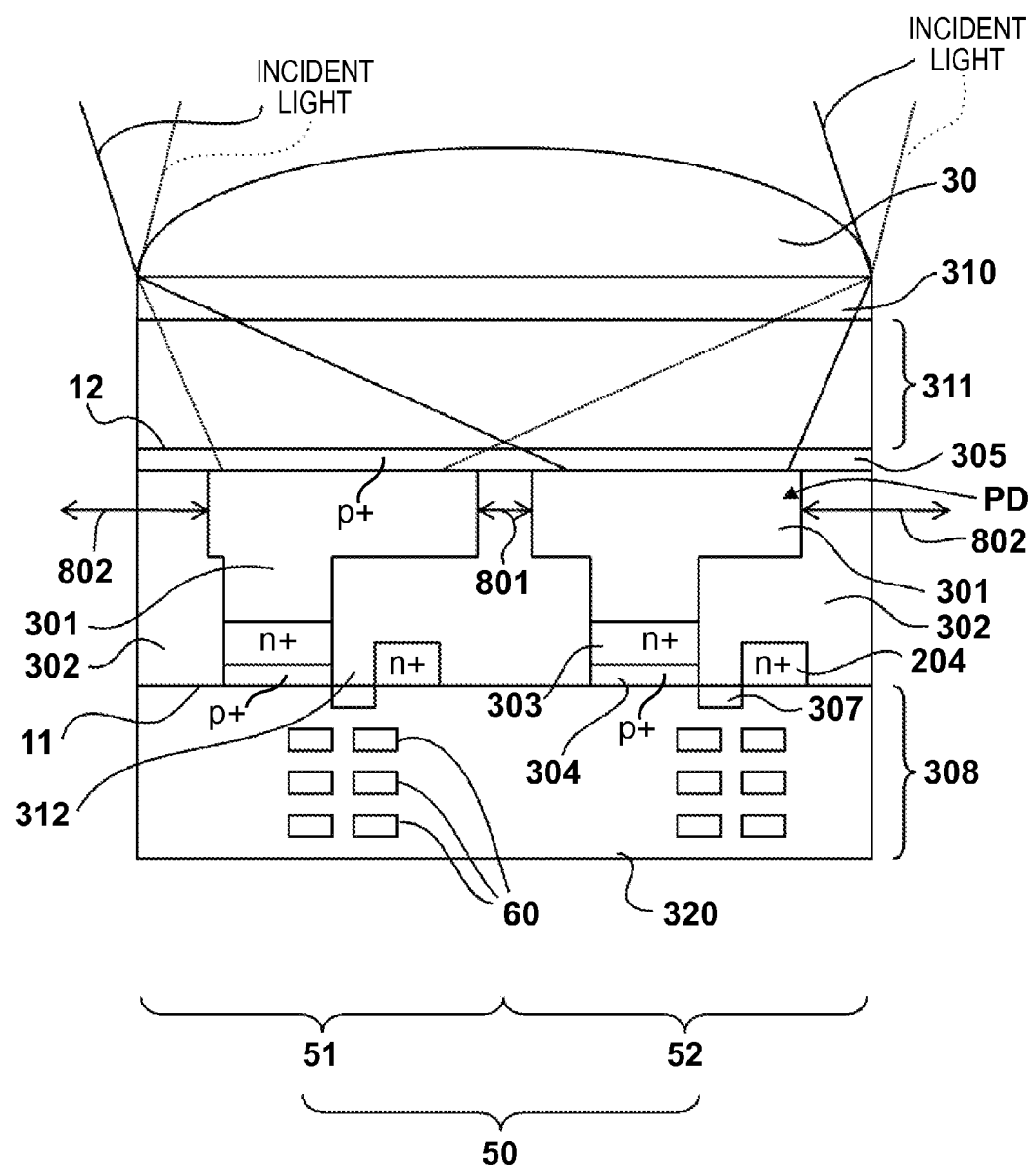
FIG. 8 is a sectional view showing a configuration example of a pixel group according to the fourth embodiment.

In the configuration of FIG. 8, reference numeral 801 denotes a minimum width between photoelectric converters PD of the pixels 51 and 52 which belong to the single pixel group 50; and 802, a minimum distance between photoelectric converters PD of pixels which belong to different pixel groups 50. As a characteristic feature, the minimum width 801 is smaller than the minimum distance 802. According to this configuration, charges generated in an isolation region between photoelectric converters PD of pixels which correspond to a single microlens 30, that is, those which belong to a single pixel group 50, can be easily accumulated by any of these photoelectric converters PD, thus contributing to improvement of sensitivity. On the other hand, charges generated in an isolation region between photoelectric converters PD of pixels corresponding to different microlenses 30, that is, those which belong to different pixel groups 50, is hardly accumulated by any of photoelectric converters PD, thus contributing to prevention of color mixing.

Figure 9:
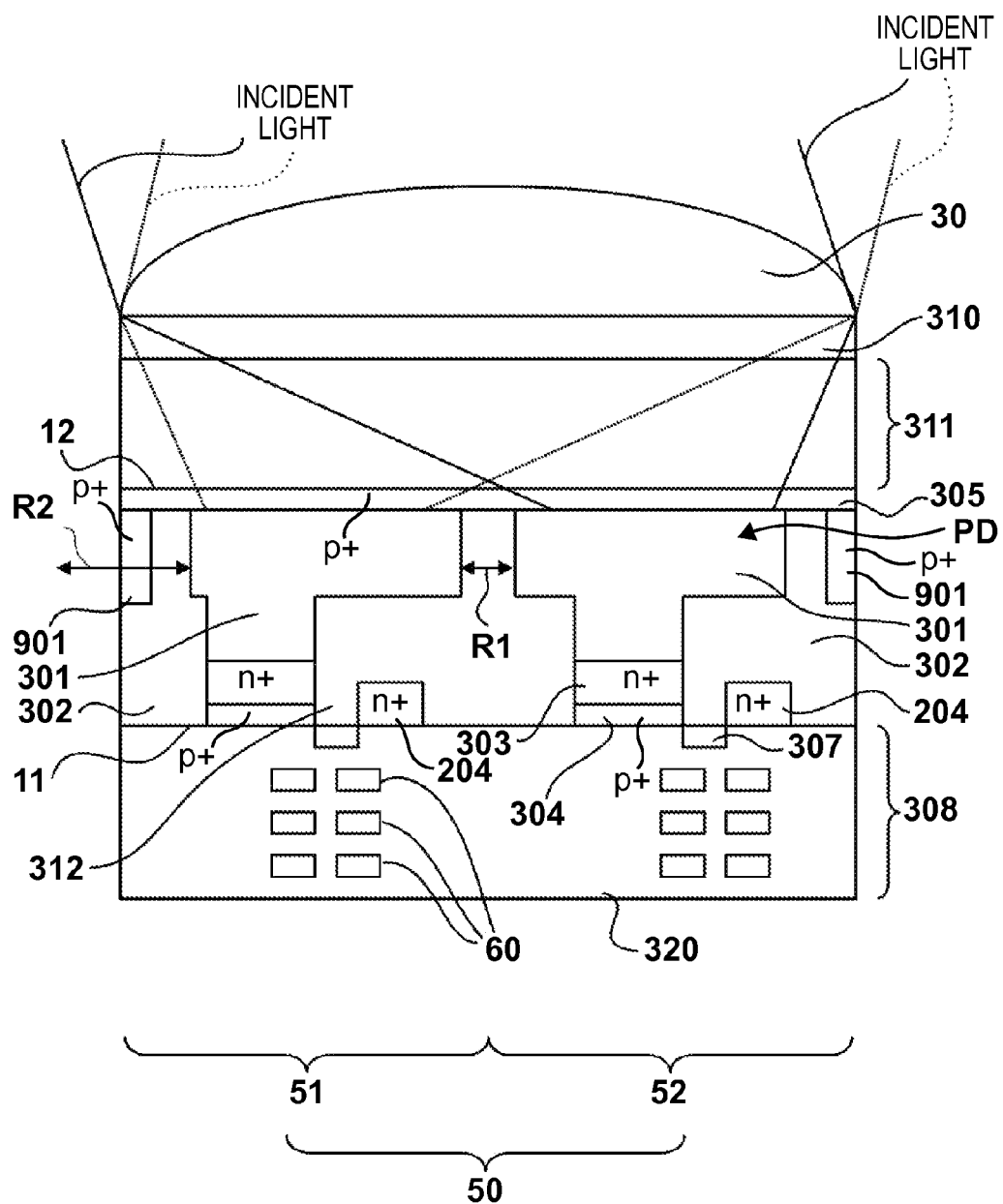
FIG. 9 is a sectional view showing a configuration example of a pixel group according to the fourth embodiment.

In the configuration of FIG. 9, a p$^+$-type region 901 is located between photoelectric converters PD of pixels corresponding to different microlenses 30, that is, those which belong to different pixel groups 50. A potential gradient is formed by arranging the p$^+$-type region 901, charges generated on the right side of the p$^+$-type region 901 is accumulated by the right photoelectric converter PD, and that generated on the left side is accumulated by the left photoelectric converter PD. Any charge movement beyond the p$^+$-type region 901 never occurs, thus eliminating color mixing. Note that the depth of the p$^+$-type region 901 may reach a substrate face on the wiring layer 308 side, that is, the first face 11.

A technical idea of arrangement of the p$^+$-type region 901 can be more generally explained as follows. Let C1 be a maximum value of a p-type impurity concentration (an impurity concentration of a second conductivity type) in a region R1 between n-type regions 301 (semiconductor regions of a first conductivity type) corresponding to a minimum distance between the n-type regions 301 of the photoelectric converters PD between pixels which belong to a single pixel group 50. Also, let C2 be a maximum value of a p-type impurity concentration (an impurity concentration of the second conductivity type) in a region R2 between the n-type regions 301 corresponding to a minimum distance between the n-type regions 301 of the photoelectric converters PD between pixels which belong to different pixel groups 50. In this case, the n-type region 301 is a semiconductor region which can accumulate charges as a signal. The region R1 is a p-well 312, and the region R2 includes a p$^+$-type region 901 formed by injecting a p-type impurity in a p-well 302. Therefore, the maximum value C1 of the p-type impurity concentration (the impurity concentration of the second conductivity type) in the region R1 is smaller than the maximum value C2 of the p-type impurity concentration (the impurity concentration of the second conductivity type) in the region R2.

A solid-state image sensor according to the fifth embodiment of the present invention will be described below with reference to FIG. 10. Items which are not mentioned in this embodiment can follow the first to fourth embodiments. In the fifth embodiment, two photoelectric converters PD share one floating diffusion 204 and amplifier transistor 205. According to this configuration, signals from the two photoelectric converters PD are output via equal routes, and noise components and the like are equal to each other, thus improving the signal precision.

Figure 10:
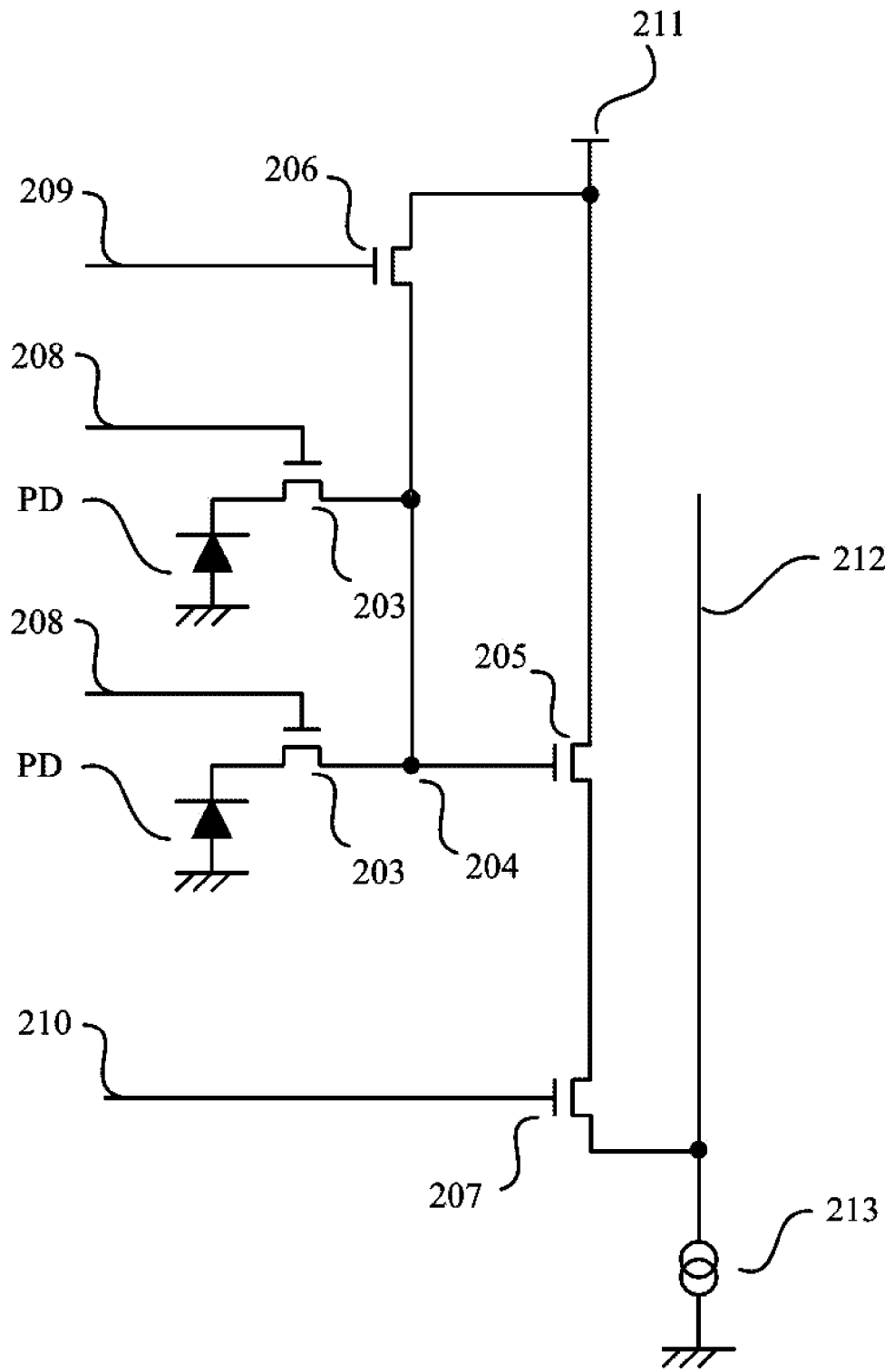
FIG. 10 is a circuit diagram showing an example of the circuit configuration (equivalent circuit) of a pixel according to the fifth embodiment.

In the circuit shown in FIG. 10, for example, two diffusion-type regions (those illustrated as the floating diffusions 204) shown in FIG. 9 can be coupled via a wiring pattern to configure one floating diffusion. However, when such wiring pattern is used, a parasitic capacitance is added, thus increasing the capacitance of the floating diffusion. Hence, it is preferable to locate the two diffusion-type regions which configure the floating diffusion at positions which are close to each other. Since a wiring length that connects the two diffusion-type regions can be shortened by the configuration shown in FIG. 4D, the capacitance of the floating diffusion can be reduced more.

The amount of charges accumulated by the photoelectric converter PD are converted into a voltage by the floating diffusion, and is supplied to an input of the amplifier transistor. When the capacitance of the floating diffusion is small, a small amount of charges can be converted into a large signal voltage. For this reason, that signal voltage is insusceptible to noise superposed by a read circuit after the floating diffusion, thus improving the S/N.

A solid-state image sensor according to the sixth embodiment of the present invention will be described below with reference to FIG. 11. Items which are not mentioned in this embodiment can follow the first to fifth embodiments. FIG. 11 is a sectional view showing a physical configuration example of two photoelectric converters PD, a gate electrode of a transfer transistor 203, and a floating diffusion 204 in the circuit configuration shown in FIG. 10. The floating diffusion 204 is located between the photoelectric converter PD of a pixel 51 and that of a pixel 52 in a pixel group 50. This configuration does not require any wiring pattern unlike in the configuration which connects two diffusion-type regions, and contributes to a reduction of the capacitance of the floating diffusion.

As the seventh embodiment, a solid-state image sensor added with functions other than image sensing and focus detection functions will be described below. In a configuration in which one microlens is formed for one pixel group including a plurality of pixels, a dynamic range expansion function can be added. A ratio between charges accumulated on photoelectric converters and a final output voltage of the solid-state image sensor is called a charge conversion coefficient. When charges accumulated on the photoelectric converters are equal to each other, an output voltage becomes larger with increasing charge conversion coefficient. In this case, a charge conversion coefficient of at least one pixel of a plurality of pixels formed under one microlens is designed to be smaller than other pixels. Then, the pixel having the small charge conversion coefficient generates a low output voltage even when it receives a charge of the same magnitude. Therefore, when an output voltage range is fixed, a charge larger than a saturated charge amount of a pixel having a large charge conversion coefficient can be read out from the pixel with the small charge conversion coefficient. By contrast, in a low-luminance region, the pixel with the large charge coefficient which can obtain a large output voltage even by a small signal charge is advantageous in terms of the S/N. Hence, outputs of pixels having the large charge conversion coefficient are used in the low-luminance region, and an output of the pixel having the low charge conversion coefficient is used in a high-luminance region where the outputs of these pixels are saturated. In this manner, a plurality of pixel outputs having different charge conversion coefficient values are combined, thus expanding the dynamic range.

In addition, as strobe light control pixels, some pixels may have a global electronic shutter function. By adding active elements including memories to elements which configure some pixels, such function can be implemented.

As an application example of the solid-state image sensor according to the above embodiments, a camera which incorporates the solid-state image sensor will be exemplified below. The concept of the camera includes not only an apparatus primarily intended to an image capturing operation, but also an apparatus which includes the image capturing function as an auxiliary function (for example, a personal computer and mobile terminal). The camera includes the solid-state image sensor according to the present invention exemplified as the embodiments, and a processing unit which processes a signal output form the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-219562, filed Oct. 3, 2011 which is hereby incorporated by reference herein in its entirety.

What is claimed is:

1. A solid-state image sensor including a semiconductor substrate having a first face and a second face opposite to the first face, the solid-state image sensor comprising:
    a plurality of pixel groups each including a plurality of pixels, each pixel having a photoelectric converter formed in the semiconductor substrate and a wiring layer that configures a part of a circuit in the pixel, the photoelectric converter including a region whose major carriers are the same as charges to be accumulated in the photoelectric converter as a signal; and
    a plurality of microlenses that are located so that one microlens is arranged for each pixel group,
    wherein each wiring layer is located at a side of the first face of the semiconductor substrate, and the plurality of microlenses are located at a side of the second face of the semiconductor substrate,
    wherein light-incidence faces of the regions of the photoelectric converters of each pixel group are arranged along the second face such that the light-incidence faces are apart from each other in a direction along the second face,
    wherein the photoelectric converter includes a semiconductor region of a first conductivity type, which is configured to accumulate charges as a signal, and
    a maximum value of an impurity concentration of a second conductivity type in a region between two nearest semiconductor regions, of the semiconductor regions of the plurality of pixels that belong to a single pixel group, is smaller than a maximum value of an impurity concentration of the second conductivity type in a region between two nearest semiconductor regions, of the semiconductor regions of the plurality of pixels that belong to different pixel groups.

2. A camera comprising:
    a solid-state image sensor according to claim 1; and
    a processing unit that processes a signal output from said solid-state image sensor.

3. A solid-state image sensor including a semiconductor substrate having a first face and a second face opposite to the first face, the solid-state image sensor comprising:
    pixel groups each including photoelectric converters located in the semiconductor substrate and arranged along the second face;
    a wiring layer located at a side of the first face of the semiconductor substrate;
    microlenses located at a side of the second face of the semiconductor substrate; and
    color filters located between the microlenses and the semiconductor substrate, the color filters including a plurality of color types having colors different from each other, wherein the microlenses are arranged such that each of the microlenses is provided for corresponding one of the pixel groups, wherein the color filters are arranged such that only one color type of the plurality of color types is provided for corresponding one of the pixel groups, wherein each of the pixel groups includes a first photoelectric converter of the photoelectric converters and a second photoelectric converter the photoelectric converters, wherein the first photoelectric converter has a first semiconductor region of a first conductivity type that is configured to accumulate charges as a signal, and the second photoelectric converter has a second semiconductor region of the first conductivity type, and wherein a minimum distance between the first and second semiconductor regions is smaller than a minimum distance between the first semiconductor region or the second semiconductor region and another semiconductor region of another photoelectric converter that is arranged in another pixel group.

4. A solid-state image sensor including a semiconductor substrate having a first face and a second face opposite to the first face, the solid-state image sensor comprising:

pixel groups each including photoelectric converters located in the semiconductor substrate and arranged along the second face;

a wiring layer located at a side of the first face of the semiconductor substrate;

microlenses located at a side of the second face of the semiconductor substrate; and color filters located between the microlenses and the semiconductor substrate, the color filters including a plurality of color types having colors different from each other, wherein the microlenses are arranged such that each of the microlenses is provided for corresponding one of the pixel groups, wherein the color filters are arranged such that only one color type of the plurality of color types is provided for corresponding one of the pixel groups, wherein each of the photoelectric converters includes a semiconductor region of a first conductivity type, wherein each of the pixel groups includes a first photoelectric converter of the photoelectric converters and a second photoelectric converter of the photoelectric converters, and wherein a minimum distance between the semiconductor region of the first photoelectric converter and the second semiconductor region of the second photoelectric converter is smaller than a minimum distance between the semiconductor region of the first photoelectric converter and the semiconductor regions of the photoelectric converters in another pixel group.

5. A solid-state image sensor including a semiconductor substrate having a first face and a second face opposite to the first face, the solid-state image sensor comprising:

pixel groups each including photoelectric converters located in the semiconductor substrate and arranged along the second face;

a wiring layer located at a side of the first face of the semiconductor substrate;

microlenses located at a side of the second face of the semiconductor substrate; and color filters located between the microlenses and the semiconductor substrate, the color filters including a plurality of color types having colors different from each other, wherein the microlenses are arranged such that each of the microlenses is provided for corresponding one of the pixel groups, wherein the color filters are arranged such that only one color type of the plurality of color types is provided for corresponding one of the pixel groups, wherein each of the photoelectric converters includes a semiconductor region of a first conductivity type, wherein each of the pixel groups includes a first photoelectric converter of the photoelectric converters and a second photoelectric converter of the photoelectric converters, and wherein a maximum value of an impurity concentration of a second conductivity type, opposite to the first conductivity type, in a region between the semiconductor region of the first photoelectric converter and the semiconductor region of the second photoelectric converter, is smaller than a maximum value of an impurity concentration of the second conductivity type in another region between the semiconductor region of the first photoelectric converter and the semiconductor region of the photoelectric converters in another pixel group.

6. A camera comprising:
a solid-state image sensor according to claim 3; and
a processing unit that processes a signal output from the solid-state image sensor.

7. A camera comprising:
a solid-state image sensor according to claim 4; and
a processing unit that processes a signal output from said solid-state image sensor.

8. A camera comprising:
a solid-state image sensor according to claim 5; and
a processing unit that processes a signal output from said solid-state image sensor.

* * * * *